United States Patent [19]
Watanabe et al.

[11] Patent Number: 5,852,391
[45] Date of Patent: Dec. 22, 1998

[54] MICROWAVE/MILLIMETER-WAVE FUNCTIONAL MODULE PACKAGE

[75] Inventors: Shin Watanabe; Tominaga Watanabe; Hideki Ikuta, all of Kawasaki, Japan

[73] Assignee: Fujitsu Limited, Kanagawa, Japan

[21] Appl. No.: 680,788

[22] Filed: Jul. 16, 1996

[30] Foreign Application Priority Data

Nov. 8, 1995 [JP] Japan ................................. 7-290140

[51] Int. Cl.⁶ ............................. H01P 5/00; H01L 29/40
[52] U.S. Cl. .......................... 333/246; 257/664; 257/728; 333/247
[58] Field of Search .................................. 333/246, 247; 257/664, 728; 330/307

[56] References Cited

U.S. PATENT DOCUMENTS

| | | | |
|---|---|---|---|
| 4,725,878 | 2/1988 | Miyauchi et al. | 257/664 |
| 4,899,118 | 2/1990 | Polinski | 333/246 |
| 5,369,379 | 11/1994 | Fujiki | 333/246 X |
| 5,451,818 | 9/1995 | Chan et al. | 257/728 |

FOREIGN PATENT DOCUMENTS 0503200  9/1992  Japan.

*Primary Examiner*—Paul Gensler
*Attorney, Agent, or Firm*—Helfgott & Karas, P.C.

[57] ABSTRACT

A high-performance low-cost functional module package handles microwaves or millimeter waves. The package has multilayered dielectric substrates, signal through holes (25, 28) connected to signal conductors that are formed on one of the dielectric substrates, and ground through holes (24, 26, 27, 29) connected to ground conductors that are formed on another of the dielectric substrates. The through holes are formed on side faces of the dielectric substrates and serve as terminals. Each pair of the ground through holes (24 and 26, or 27 and 29) is arranged on opposite sides of a corresponding one (25 or 28) of the signal through holes. The terminals are positioned between parts of the package to be connected to an external circuit board and the signal and ground conductors.

15 Claims, 16 Drawing Sheets

$$\text{CHARACTERISTIC IMPEDANCE } Z_0 = \sqrt{\frac{L}{C}}$$

MICROWAVE/MILLIMETER-WAVE FUNCTIONAL MODULE PACKAGE

BACKGROUND OF THE INVENTION

1. Field of the Invention

The present invention relates to a microwave/millimeter-wave functional, module package, and particularly, to a module package for microwave or millimeter-wave radio equipment, having, for example, a high-frequency-signal amplification function or a frequency conversion function.

2. Description of the Related Art

Due to band congestion in radio communication, there is a need to use high-frequency millimeter waves. One of the technical problems to be solved in developing millimeter-wave radio equipment is packaging. If millimeter waves are widely used for personal communication in the future, it must be necessary to mass-produce many millimeter-wave terminals. In this case, the terminals must have high-frequency functional module packages that are easy to mass-produce at low cost. The packages incorporate modules for converting the frequency of a microwave or a millimeter wave into another, multiplying a frequency, or amplifying a signal. The packages are properly arranged in a transceiver section of each terminal.

The functional module package usually involves high cost because it must be mechanically processed and metallized with gold. A single package costs, for example, $40 dollars to $50 dollars. Even if the package is manufactured with a special mold, it will cost about $10 dollars to $15 dollars. To reduce the cost, the number of functional module packages mounted on a single terminal must be reduced. It is, however, very difficult to reduce the number because the functional modules such as frequency converter modules and signal amplifier modules are essential to the terminal. It is, therefore, hard to lower the cost of the terminal as long as the functional modules employ such expensive packages.

SUMMARY OF THE INVENTION

An object of the present invention is to provide a microwave/millimeter-wave functional module package that can be mass-produced at low cost.

In order to accomplish the object, the present invention provides a microstrip-signal-type functional module package having multilayered dielectric substrates, signal through holes connected to signal conductors that are formed on one of the dielectric substrates, and ground through holes connected to ground conductors that are formed on another of the dielectric substrates. The through holes are formed on side faces of the dielectric substrates and serve as terminals. Each pair of the ground through holes is arranged on opposite sides of a corresponding one of the signal through holes. The terminals are positioned between parts of the package to be connected to an external circuit board and the signal and ground conductors.

The present invention also provides a coplanar-signal-type functional module package having multilayered dielectric substrates, signal through holes connected to signal conductors that are formed on one of the dielectric substrates, and ground through holes connected to ground conductors that are formed on the same dielectric substrate on which the signal conductors are formed. The through holes are formed on side faces of the dielectric substrates and serve as terminals. Each pair of the ground through holes is arranged on opposite sides of a corresponding one of the signal through holes. The terminals are positioned between parts of the package to be connected to an external circuit board and the signal and ground conductors.

The ground conductors are connected to another ground conductor with through holes. The latter ground conductor has a shield. The shield is usually a metal lid for protecting internal circuits incorporated in the package. Instead of the shield, the plane where the shield is to be formed on the package may be attached to a ground pattern formed on the external circuit board.

Gaps between each of the signal through holes and corresponding ones of the ground through holes are set to provide a required characteristic impedance.

The package may be horizontally mounted on an external circuit board having microstrip lines, or horizontally or vertically on an external circuit board having coplanar lines.

Each pair of the ground through holes is arranged on opposite sides of a corresponding one of the signal through holes.

If the wavelength of a microwave or millimeter-wave signal to and from a functional module mounted on a package is equal to the length of a through hole serving as a terminal of the package, the transmission characteristic of the signal will deteriorate. To solve this problem, the present invention considers the terminal, i.e., the through hole as a distributed constant line. At the same time, the present invention forms ground conductors on opposite sides of a signal conductor as shown in the accompanying drawings, to establish a coplanar-line-like transmission mode and provide the through hole, i.e., the terminal, with a required characteristic impedance.

BRIEF DESCRIPTION OF THE DRAWINGS

The present invention will be more clearly understood from the description as set forth below with reference to the accompanying drawings, in which.

DESCRIPTION OF THE PREFERRED EMBODIMENTS

For a better understanding of the preferred embodiments of the present invention, the problem in the prior art will be explained.

Figure 1:
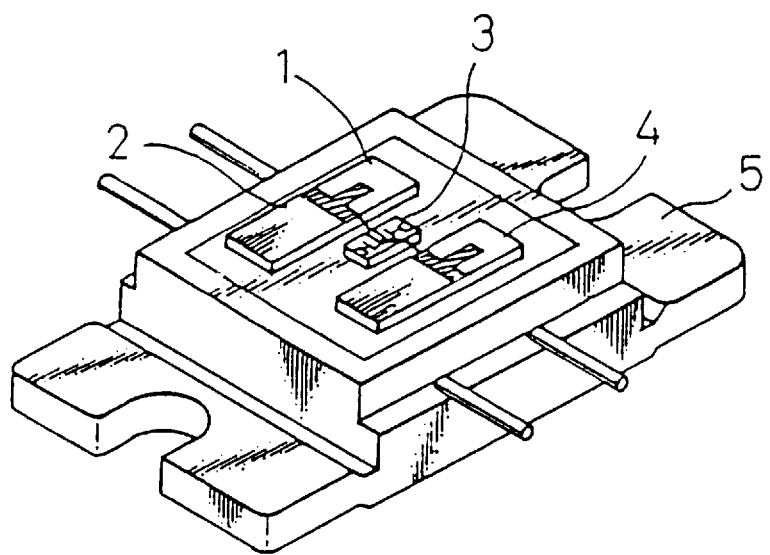
FIG. 1 is a perspective view showing a microwave functional module package according to a prior art.

FIG. 1 is a perspective view showing a functional module package according to the prior art. This package is used for microwave or millimeter-wave radio equipment. The package 5 is made of metal such as oxygen-free copper, Kovar, or copper tungsten one of which is selected depending on objects such as preventing deformation due to a change in temperature or suppressing an increase in device temperature. The package 5 accommodates a semiconductor device 3, an I/O matching circuit 2 including capacitors and ICs, and ceramic substrates 1 and 4. The surface of the package 5 is metallized with gold to mount the substrates and devices thereon with solder and gold-tin.

The gold metallization and mechanical processing carried out on the package increase the manufacturing cost of the package up to $40 dollars to $50 dollars. Even if the package is manufactured with a special mold, it will cost $10 dollars to $15 dollars. To reduce the cost of equipment on which some functional modules are mounted, the number of the modules must be reduced. It is, however, very difficult to reduce the number because the functional modules such as frequency converter modules and signal amplifier modules are essential to the equipment. As a result, it is hard to lower the cost of the equipment as long as the functional modules employ such expensive packages.

Next, preferred embodiments of the present invention will be explained. Like reference marks represent like parts throughout the figures.

Figure 2A:
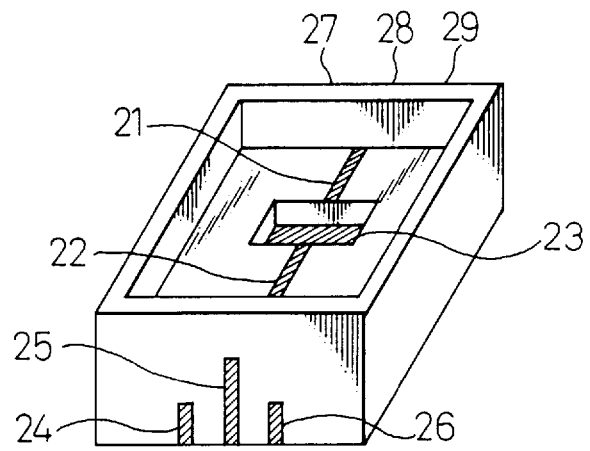
FIG. 2A is a top perspective view showing a functional module package according to a first aspect of the present invention.
Figure 2B:
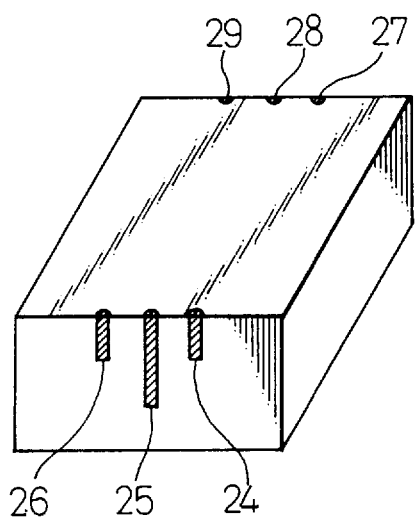
FIG. 2B is a bottom perspective view showing the package of FIG. 2B.

FIGS. 2A and 2B are perspective views showing a functional module package according to the first aspect of the present invention, in which FIG. 2A is a top view and FIG. 2B is a bottom view.

The package has multilayered substrates each made of ceramic ($Al_2O_3$). The substrates are baked and solidified into one body. Side faces of the package have signal I/O terminals 25 and 28 and ground terminals 24, 26, 27, and 29. Although the terminals 27 to 29 are not shown in the figures, they are the same as the terminals 24 to 26. The package also has signal conductors 21 and 22 and a ground conductor 23.

Figure 3A:
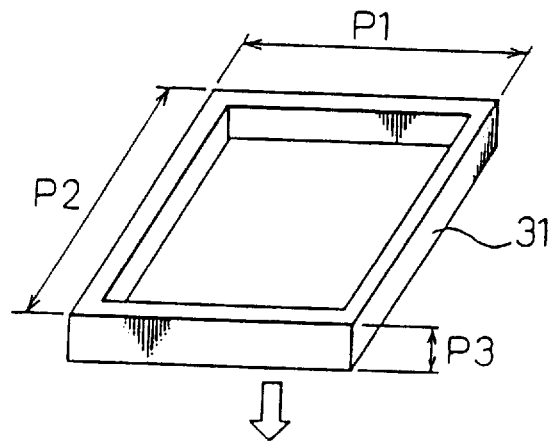
FIGS. 3A to 3C are exploded views showing substrates that form the package of FIG. 2A.
Figure 3B:
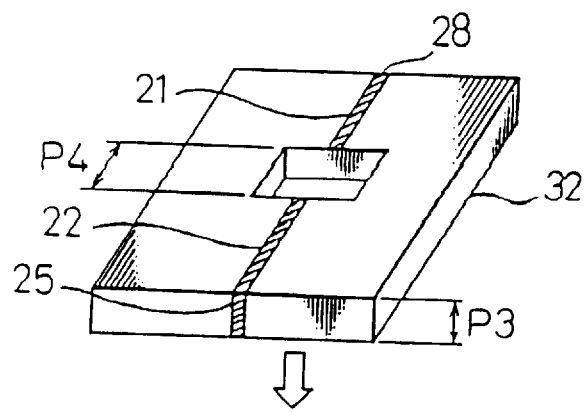
Figure 3C:
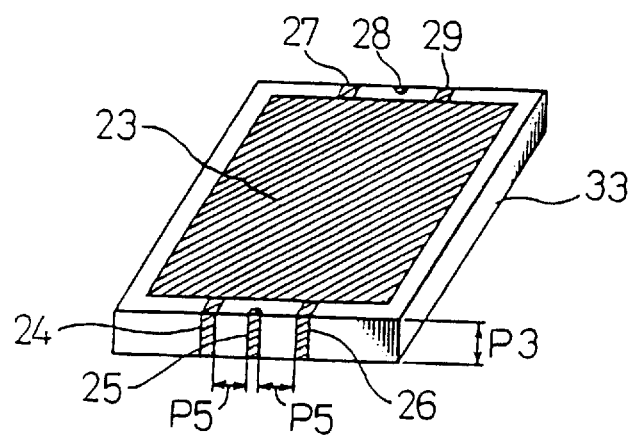

FIGS. 3A to 3C are exploded views showing the substrates of the package of FIGS. 2A and 2B.

The substrates 31 to 33 are laminated one upon another. Each of the substrates has a width P1 of 10 mm, a length P2 of 11 mm, and a thickness P3 of 0.2 mm. The conductors 21 to 23 are metallized on the corresponding substrates. Since the substrates are baked at high temperatures, the conductors 21 to 23 are made from tungsten that stands such high temperatures.

Figure 4A:
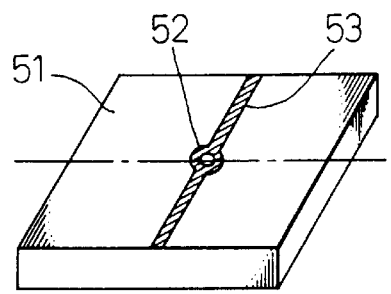
FIGS. 4A to 4C are views showing processes of forming a terminal of a functional module package according to the present invention.
Figure 4B:
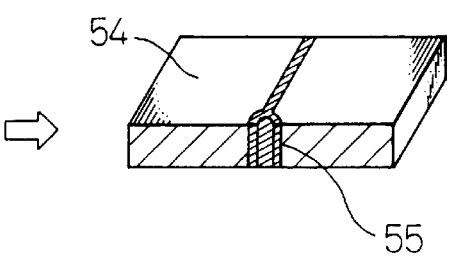
Figure 4C:
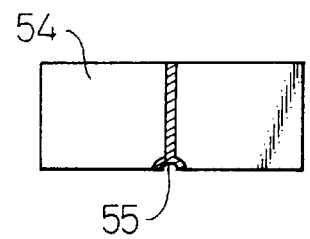

FIGS. 4A to 4C show processes of forming a through hole 52 serving as a terminal on a substrate 51.

The through hole 52 connects a top conductor 53 to a bottom conductor (not shown) both being metallized on opposite faces of the substrate 51. The substrate 51 is cut along a dash-and-dot line of FIG. 4A into a substrate 54 of FIG. 4B. The cutting is carried out with a dicing saw having a cutter made of carbon-based material such as diamond. At this time, the through hole 52 is cut along its center line into a semicircular shape 55 of FIG. 4C. The semicircular through hole 55 extending from the top to the bottom of the substrate 54 serves as a package terminal.

Returning to FIGS. 3A to 3C, the terminals 25 and 28 are signal terminals, and the terminals 24, 26, 27, and 29 are ground terminals. The terminal 25 is connected to the signal conductor 22, and the terminal 28 is connected to the signal conductor 21. The conductors 21 and 22 are metallized on the substrate 32. The width of each terminal, i.e., the diameter of a conductor formed in the through hole 55 of FIGS. 4B and 4C is 0.4 mm. The terminals 24 to 26 (27 to 29) are coplanar. Each gap P5 among the terminals 24 to 26 is 0.4 mm to form a characteristic impedance of 50 ohms between the terminals.

Gaps among package terminals will be explained with reference to FIGS. 5 to 7.

Figure 5:
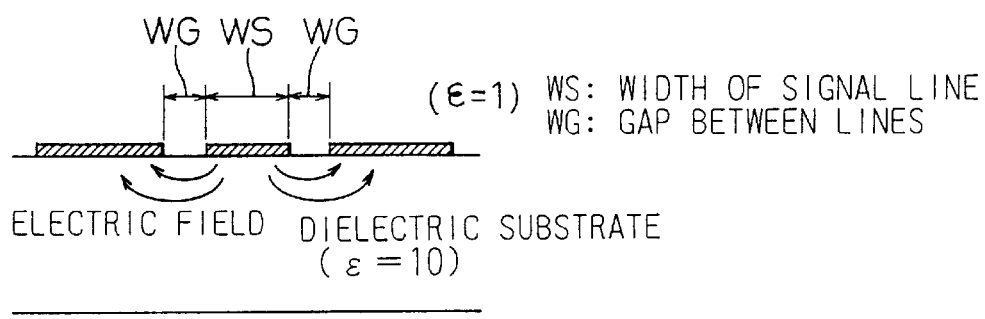
FIG. 5 shows gaps among the terminals of a functional module package.

FIG. 5 shows coplanar conductors formed on a dielectric ceramic substrate. A central one of the conductors is a signal conductor having a thickness of 2 $\mu$m and a width of 0.4 mm. The characteristic impedance of the signal conductor is determined by the width WS of the signal conductor and a gap WG between the adjacent conductors. If the thickness of the dielectric substrate is sufficiently larger than the gap WG, the characteristic impedance of the signal conductor will be 50 ohms with the ratio of the width WS to the gap WG being about 2:1. Namely, the gap WG must be 0.2 mm to achieve a characteristic impedance of about 50 ohms.

Figure 6:
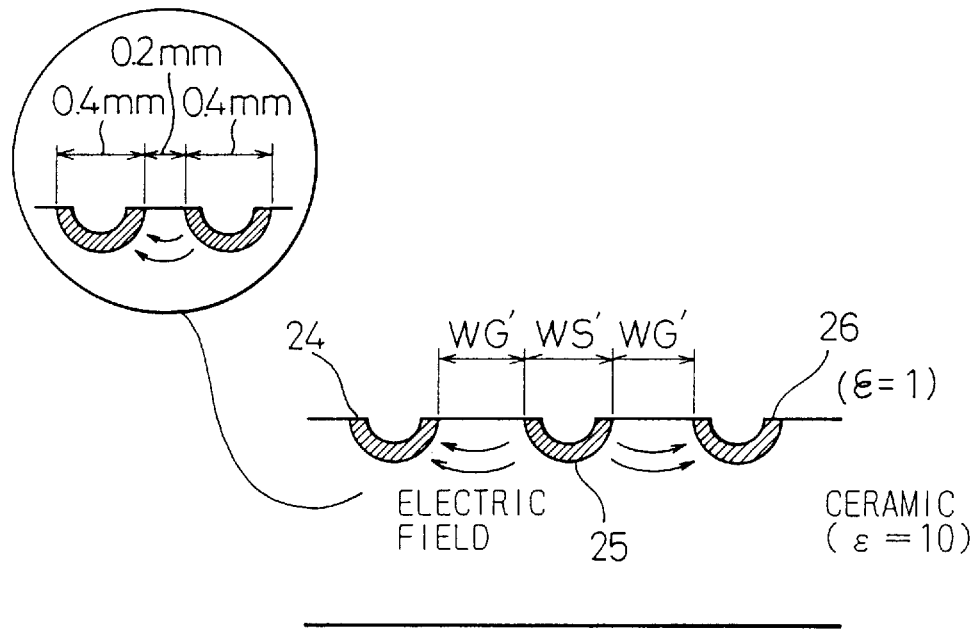
FIG. 6 shows gaps among the terminals of a functional module package.

FIG. 6 shows the semicircular terminals of the package of the present invention. The terminals are connected to coplanar conductors.

Since the terminals have each a semicircular shape, a gap WG' between conductors formed in the terminals is practically narrower than the gap WG of FIG. 5 with the width WS' of the conductor of the terminal of FIG. 6 being the same 0.4 mm as that of FIG. 5. Namely, the circular conductors involve a stronger electric field than the coplanar conductors, to reduce the characteristic impedance of each conductor.

Figure 7:
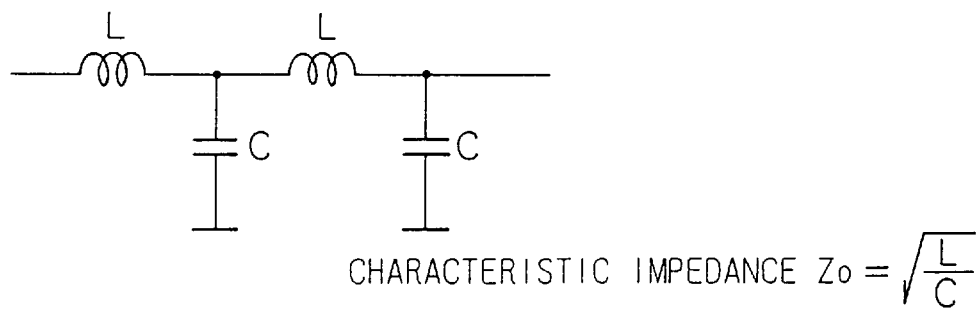
FIG. 7 shows an equivalent circuit of the terminals of a functional module package.

FIG. 7 shows an equivalent circuit of distributed-constant lines corresponding to the terminals encircled in FIG. 6.

The characteristic impedance of the conductors encircled in FIG. 6 decreases because the conductors are close to each other to increase the parallel capacitance C in FIG. 7. To prevent a decrease in the characteristic impedance, the gap WG', which is 0.2 mm in FIG. 6, between the signal and ground conductors must be increased. Accordingly, the present invention employs 0.4 mm as the gap WG'.

The relationship between the wavelength of a 60-GHz signal used for, for example, a radio LAN, and passed through a through hole conductor serving as a terminal of a ceramic substrate and the length of the through hole will be explained.

The wavelength λ of the 60-GHz signal in a free space is $\lambda=c/f=3\times10^8$ (m/s)/$60\times10^9$ (Hz)=0.005 (m)=5 (mm). The specific dielectric constant of ceramic is 10.8, and therefore, the effective dielectric constant ∈eff of a coplanar conductor is 5.7. The shortening rate of wavelength in the coplanar conductor is $1/(\text{∈eff})^{1/2}$ =0.42. Namely, the wavelength of the 60-GHz signal is changed to a guide wavelength $\lambda g=\lambda\times 0.42=2.1$ mm. The ratio of the guide wavelength λg to the length of the through hole is 0.42:2.1. Namely, the length of the through hole is ⅕ of λg, i.e., λg/5. When a signal such as a millimeter-wave signal having a short wavelength is input and output to and from a functional module, the wavelength of the signal is equalized to the length of the through hole serving as a terminal. Accordingly, the through hole, i.e., the terminal must be handled as a distributed-constant line.

Returning to FIGS. 3A to 3C, the ground terminals 24, 26, 27, and 29 are connected to the conductor 23 metallized on the substrate 33. The conductors 21 and 22 are microstrip lines with the substrate 32 serving as a dielectric substrate. The conductor 23 on the substrate 33 serves as a grounding plane for the microstrip lines 21 and 22. Each of the conductors 21 and 22 has a length of 5 mm and a width of 0.2 mm. The characteristic impedance of the microstrip lines is calculated according to the specific dielectric constant and thickness of the ceramic substrate. Since the specific dielectric constant of the ceramic substrate 32 is about 10 and the thickness thereof is 0.2 mm, the width of each microstrip line must be about 0.2 mm to achieve a characteristic impedance of 50 ohms. Namely, the characteristic impedance of each of the microstrip conductors 21 and 22 of the embodiment is 50 ohms.

A square recess formed at the center of the substrate 32 is a space for mounting an electronic device on the conductor 23. The electronic device may be an active device such as a transistor or a passive device such as a capacitor. After the ceramic substrates are baked and solidified, the conductor 23 exposed in the space is metallized with gold, and a bare chip device such as a transistor or a microchip capacitor is mounted in the space with solder such as gold-tin. The mounted device is connected to the conductors 21 and 22 on the substrate 32 with gold wires by a wire bonding apparatus.

Figure 8:
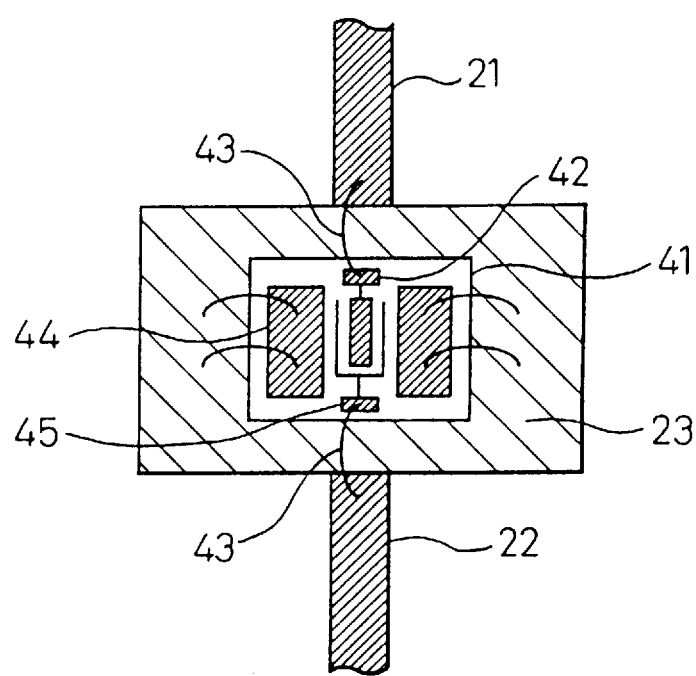
FIG. 8 is an enlarged view showing a device mounted on the package of FIG. 2A.

FIG. 8 is an enlarged view showing an example of an electronic device mounted in the space of FIG. 3B.

In this example, the electronic device is a field-effect transistor 41 serving as a signal amplifier. A gate pad 45 of the transistor 41 is connected to the input conductor 22 with a gold wire 43, and a drain pad 42 thereof is connected to the output conductor 21 with a gold wire 43. Source pads 44 thereof are connected to the ground conductor 23 with gold wires. A power source is biased to the transistor 41. The terminal 25 serves as a signal input terminal, and the terminal 28 as a signal output terminal. A signal supplied to the input terminal 25 passes through the conductor 22 and is amplified by the transistor 41. The amplified signal passes through the conductor 21 and is output from the output terminal 28. In this case, the package (FIGS. 2A and 2B) serves as an amplifier module package having a microwave signal amplification function.

Figure 9A:
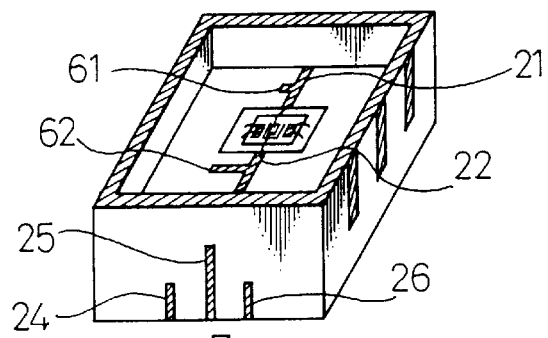
FIGS. 9A to 9C show ways of mounting the package of FIG. 2A on an external circuit board.
Figure 9B:
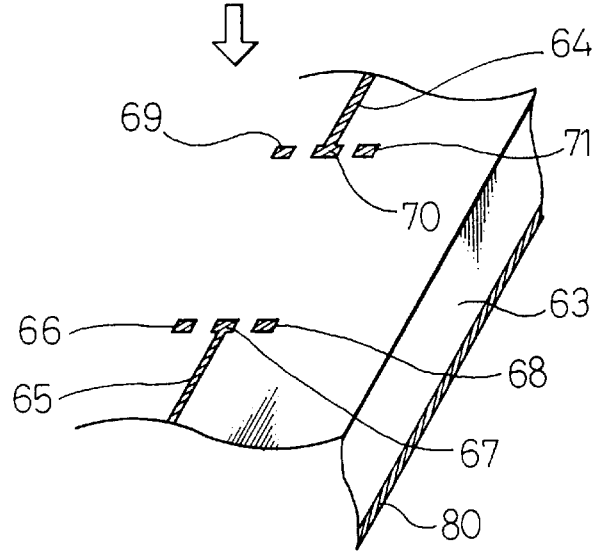
Figure 9C:
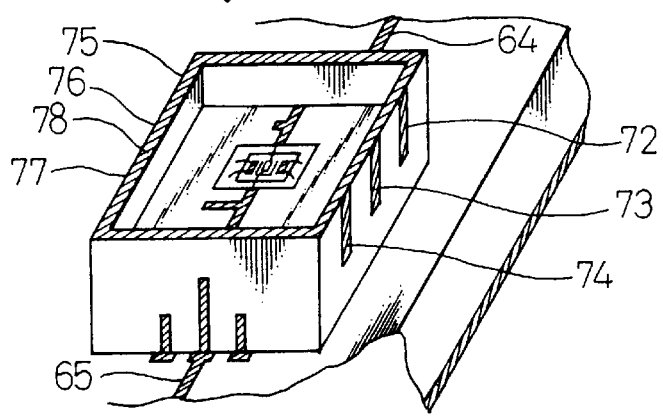

FIGS. 9A to 9C show the functional module package of FIGS. 2A and 2B mounted on an external circuit board.

The package additionally has terminal open matching circuit stubs 61 and 62 that are distributed-constant circuits metallized with the same material as that of the conductors 21 and 22. The width of a terminal, i.e., the diameter of the conductor of the through hole 55 (FIGS. 4A to 4C) is 0.4 mm. The gaps P5 between the signal terminal 25 and the ground terminals 24 and 26 are each 0.4 mm to secure a characteristic impedance of 50 ohms.

The functional module package is mounted on the external circuit board 63. The board 63 is made of a dielectric substrate on which microstrip lines 64 and 65 are formed. The bottom of the board 63 has a ground conductor 80. The terminal 25 of the package is connected to a mounting pattern 67 of the board 63, the terminal 24 to a pattern 66, and the terminal 26 to a pattern 68. The patterns 66 and 68 are connected to the ground conductor 80 with through holes. Similarly, the terminals 27 to 29 of the package are connected to mounting patterns 69 to 71, respectively. Usually, the terminals of the package are connected to the board 63 by reflow or conductive adhesives with solder being arranged on the board 63 in advance.

In FIGS. 9A to 9C, the side faces of the package have terminals 72 to 77 that are connected to the conductor 23 (FIG. 3C). The top of the substrate 31 is metallized as indicated with a reference numeral 78.

Figure 10:
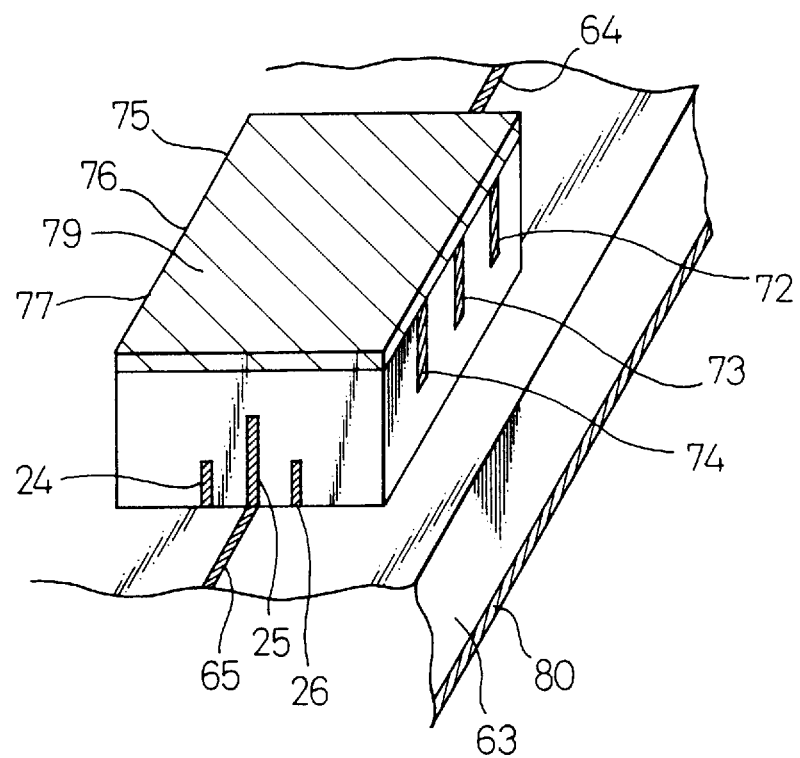
FIG. 10 is a perspective view showing the package of FIG. 2A mounted on the external circuit board.

FIG. 10 shows a metal lid 79 attached to the conductor 78 with gold-tin. This arrangement prevents signals from leaking outside the package and secures airtightness.

FIGS. 11 to 13C show another functional module package according to the first aspect of the present invention.

This package differs from that of FIG. 2A in that signal and ground terminals 24 to 26 and 27 to 29 are formed on an upper part of the package. The other arrangements of the package of FIG. 11 are the same as those of FIG. 2A.

Figure 11:
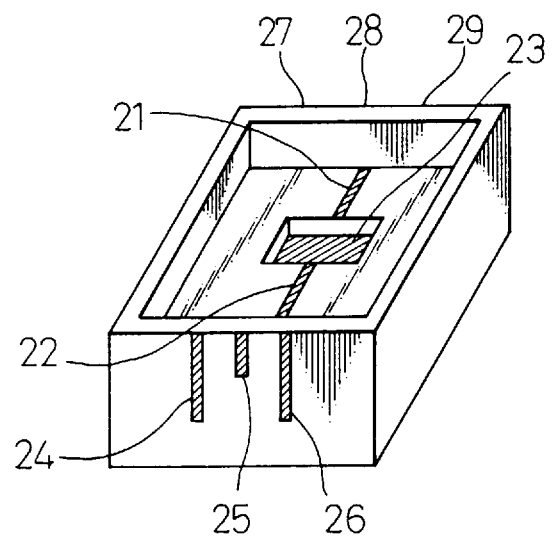
FIG. 11 is a perspective view showing another functional module package according to the first aspect of the present invention.
Figure 12A:
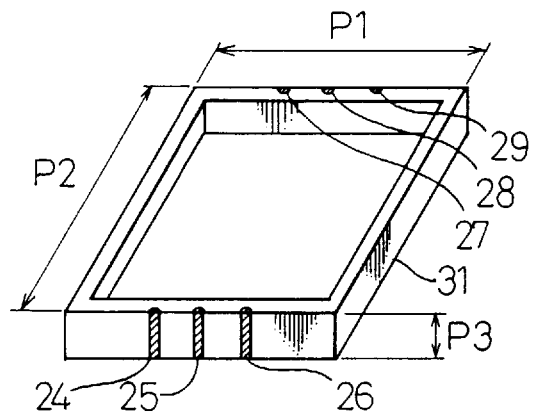
FIGS. 12A to 12C are exploded views showing substrates that form the package of FIG. 11.
Figure 12B:
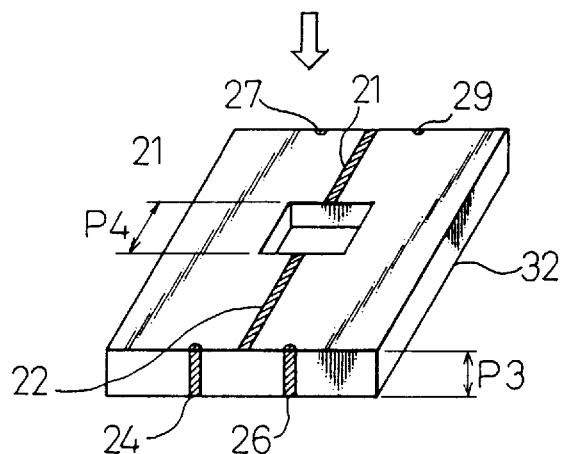
Figure 12C:
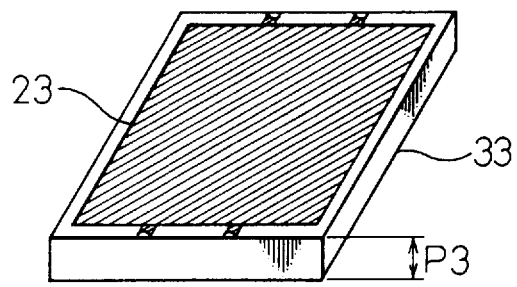

FIGS. 12A to 12C are exploded views showing substrates 31 to 33 that form the package of FIG. 11. The signal I/O terminals 25 and 28 are formed on side faces of the substrate 31 and are connected to signal conductors 22 and 21 that are formed on the substrate 32. The ground terminals 24, 26, 27, and 29 are formed on side faces of the substrates 31 and 32 and are connected to a ground conductor 23 formed on the substrate 33.

Figure 13A:
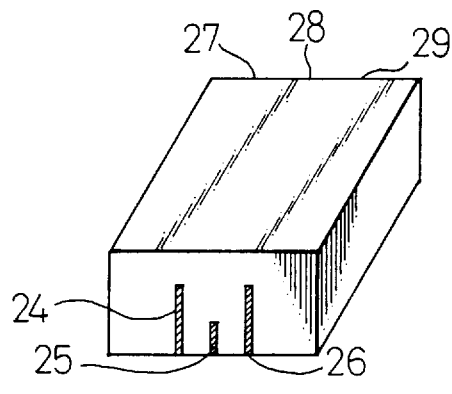
FIGS. 13A to 13C show ways of mounting the package of FIG. 11 on an external circuit board.
Figure 13B:
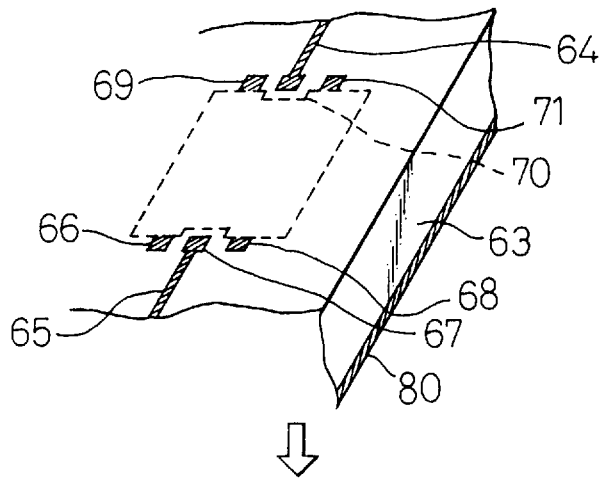
Figure 13C:
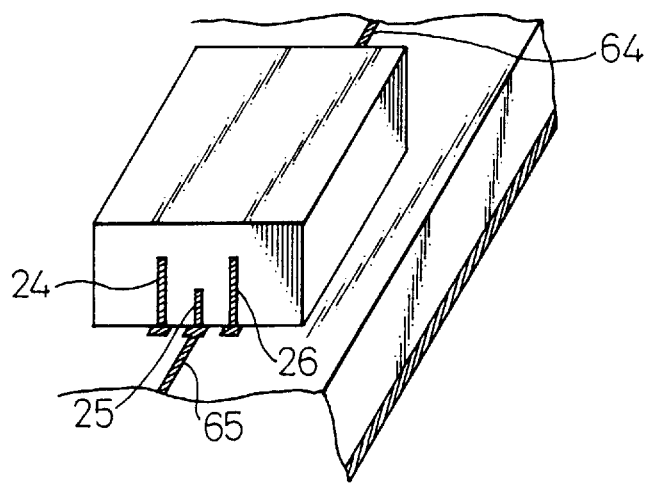

FIGS. 13A to 13C show the package of FIG. 11 mounted on an external circuit board. Since the terminals 24 to 26 and 27 to 29 are formed on the upper part of the package, the package is turned upside down and is mounted on the circuit board 63. This package does not need the metal lid 79 of FIG. 10, and therefore, the cost is further reduced. As indicated with a dotted line in FIG. 13B, the circuit board 63 may have a grounding pattern where the package is to be mounted, to provide the same effect as the metal lid 79. The other arrangements are the same as those of FIGS. 9A to 9C.

Figure 14A:
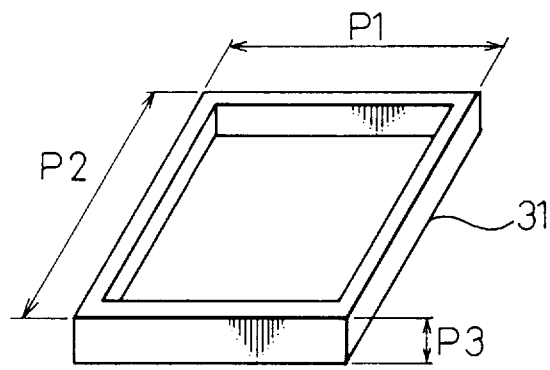
FIGS. 14A to 14C are exploded views showing substrates that form a functional module package according to a second aspect of the present invention.
Figure 14B:
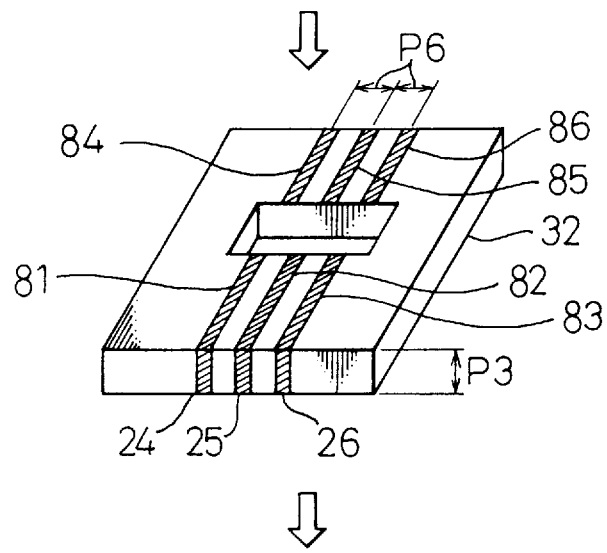
Figure 14C:
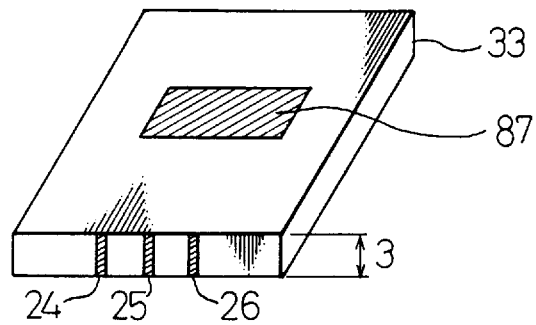

FIGS. 14A to 14C are exploded views showing substrates that form a functional module package according to the second aspect of the present invention.

The external dimensions of the substrates 31 to 33 are the same as those of the first aspect. Conductors formed on the substrate 32 of FIG. 14B are coplanar lines including signal lines 82 and 85 and ground lines 81, 83, 84, and 86. The width of each of the signal lines 82 and 85 is 0.4 mm, and the width of each of the ground lines 81, 83, 84, and 86 is 1 mm. The gaps between the signal and ground lines are each 0.2 mm, and the characteristic impedance of each line is 50 ohms. A conductor 87 is metallized on the substrate 33 as shown in FIG. 14C.

Figure 15:
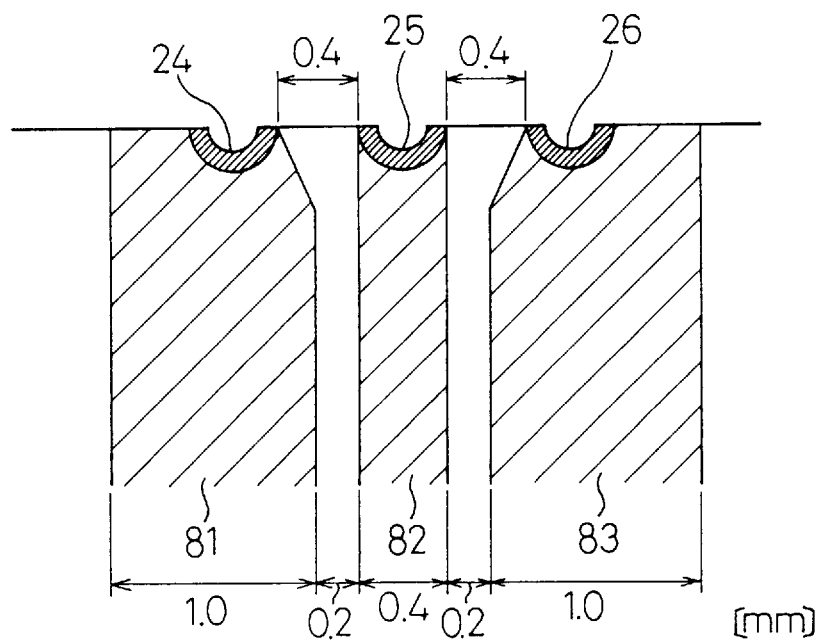
FIG. 15 shows connections between the conductors and terminals of a functional module package.

FIG. 15 is an enlarged view showing contacts between the terminals 24 to 26 and the coplanar lines 81 to 83.

Figure 16:
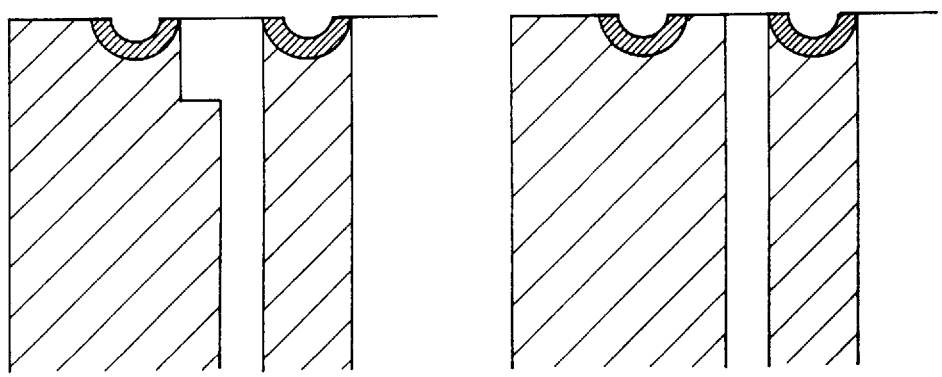
FIG. 16 shows connections between the conductors and terminals of a functional module package.

A gap between the signal terminal 25 and any one of the ground terminals 24 and 26 is 0.4 mm similar to the first aspect. On the other hand, gaps between the coplanar lines are each 0.2 mm, and therefore, parts where the coplanar lines are connected to the terminals are tapered. However, the contacts may have other shapes such as those shown in FIG. 16.

Figure 17:
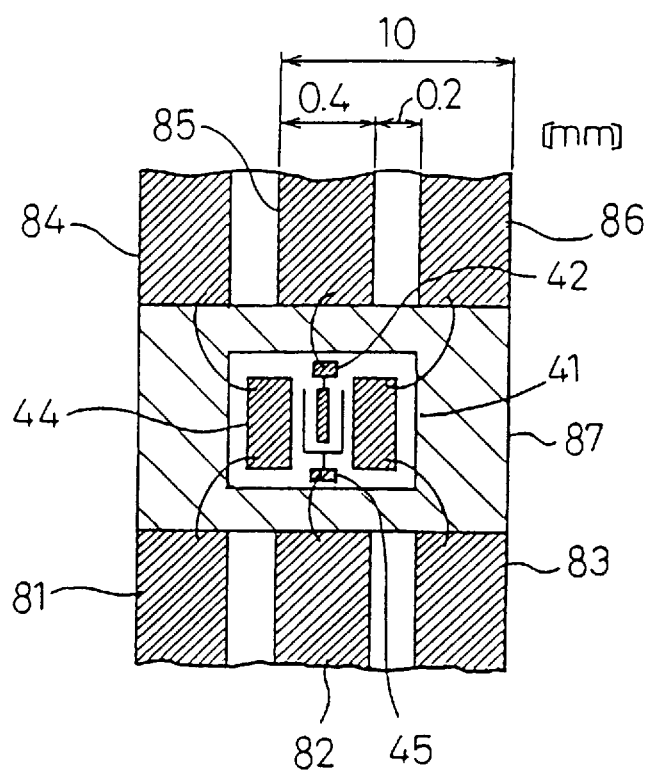
FIG. 17 is an enlarged view showing a device mounted on the package of FIGS. 14A to 14C.

FIG. 17 is an enlarged view showing a device mounted on the package of FIGS. 14A to 14C.

The device 41 is, for example, a field-effect transistor and is mounted in a mounting area 87. A gate pad 45 of the transistor 41 is connected to the input conductor 82, a drain pad 42 thereof to the output conductor 85, and source pads 44 thereof to the ground conductors 81, 83, 84, and 86 with gold wires.

Figure 18:
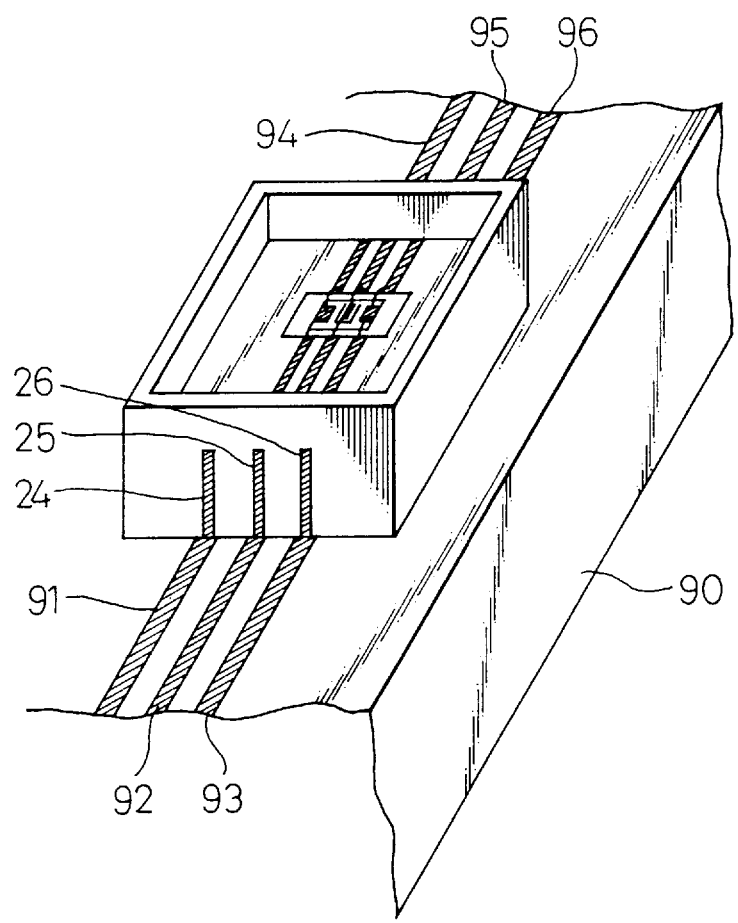
FIG. 18 is a perspective view showing the package of FIGS. 14A to 14C mounted on an external circuit board.

FIG. 18 shows the package of FIGS. 14A to 14C mounted on an external circuit board.

The ground terminals 24, 26, 27, and 29 are connected to ground lines 91, 93, 94, and 96 of the board 90, respectively. The lines formed on the board 90 are coplanar, and therefore, there is no ground conductor on the bottom of the board 90. Similar to the example of FIGS. 13A to 13C, the package of FIG. 18 may be turned upside down so that the top face thereof is in contact with the board 90.

Figure 19:
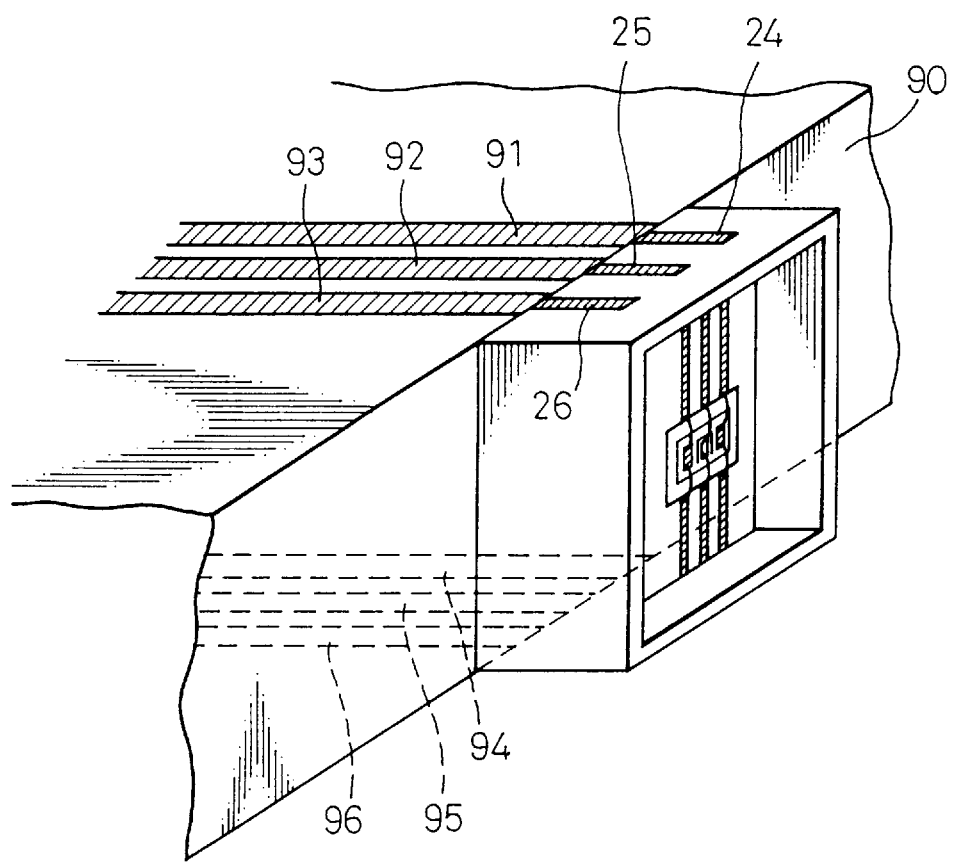
FIG. 19 is another perspective view showing the package of FIGS. 14A to 14C mounted on an external circuit board.

In FIG. 19, the conductors of the package are in parallel with those of the board 90. It is possible to vertically mount the package at an end of the board 90. In this case, the I/O parts of the package and board are separately formed on the top and bottom thereof, to surely isolate input and output signals from each other.

As explained above, the present invention produces a functional module package from multilayered substrates, to reduce the manufacturing cost of the package to about $ 1.50, far lower than that of the prior art.

The functional module package of the present invention may be attached to an external circuit board by a reflow technique, and therefore, can be automatically mounted thereon by a chip mounter.

The dielectric substrates that form the package may be made from not only ceramics but also any other material that forms layers to be laminated one upon another. Conductors formed on the dielectric substrates may be made not only of tungsten but also any other material that is capable of standing baking temperatures. The package can receive any device such as an amplifier made of a transistor and a frequency converter made of an IC chip.

In this way, the present invention forms conductors on dielectric ceramic substrates and laminates the substrates one upon another, to form a microwave/millimeter-wave functional module package that is low in cost and automatically mountable on an external circuit board.

What is claimed is:

1. A functional module package comprising:

multilayered dielectric substrates; and signal through holes (25, 28) connected to signal conductors that are formed on one of the dielectric substrates, and ground through holes (24, 26, 27, 29) connected to ground conductors that are formed on another of the dielectric substrates, the through holes being formed on side faces of the dielectric substrates and serving as terminals, each pair of the ground through holes (24 and 26, or 27 and 29) being arranged on opposite sides of a corresponding one (25 or 28) of the signal through holes, the terminals being positioned between parts of the package to be connected to an external circuit board and the signal and ground conductors.

2. The package as claimed in claim 1, wherein the ground conductors are connected to another ground conductor (79) with through holes, and the ground conductor (79) has shield means.

3. The package as claimed in claim 2, wherein the shield means is a grounding pattern formed on the external circuit board.

4. The package as claimed in claim 2, having a grounding plane connected to ground lines of the external circuit board.

5. The package as claimed in claim 1, wherein gaps between each of the signal through holes (25 and 28) and corresponding ones (24 and 26, or 27 and 29) of the ground through holes are set to provide a required characteristic impedance.

6. The package as claimed in claim. 1, horizontally mounted on the external circuit board, said board having microstrip lines.

7. The package as claimed in claim 1, used for handling microwaves or millimeter waves.

8. A functional module package comprising:

multilayered dielectric substrates; and signal through holes (25, 28) connected to signal conductors that are formed on one of the dielectric substrates, and ground through holes (24, 26, 27, 29) connected to ground conductors that are formed on the same dielectric substrate on which the signal conductors are formed, the through holes being formed on side faces of the dielectric substrates and serving as terminals, each pair of the ground through holes (24 and 26, or 27 and 29) being arranged on opposite sides of a corresponding one (25 or 28) of the signal through holes, the terminals being positioned between parts of the package to be connected to an external circuit board and the signal and ground conductors.

9. The package as claimed in claim 8, wherein the ground conductors are connected to another ground conductor (79) with through holes, and the ground conductor (79) has shield means.

10. The package as claimed in claim 9, wherein the shield means is a grounding pattern formed on the external circuit board.

11. The package as claimed in claim 9, having a grounding plane connected to ground lines of the external circuit board.

12. The package as claimed in claim 8, wherein gaps between each of the signal through holes (25 and 28) and corresponding ones (24 and 26, or 27 and 29) of the ground through holes are set to provide a required characteristic impedance.

13. The package as claimed in claim 8, horizontally mounted on the external circuit board, said board having coplanar lines.

14. The package as claimed in claim 8, vertically mounted on the external circuit board, said board having coplanar lines.

15. The package as claimed in claim 8, used for handling microwaves or millimeter waves.

* * * * *